United States Patent [19]
Chiang et al.

[11] Patent Number: 5,210,069
[45] Date of Patent: May 11, 1993

[54] PREPARATION METHOD OF HIGH PURITY 115 K TL-BASED SUPERCONDUCTOR

[75] Inventors: Chung-Kwang Chiang; Cheng-Yie Shei, both of Taipei, Taiwan

[73] Assignee: Industrial Technology Research Institute, Taiwan

[21] Appl. No.: 777,573

[22] Filed: Oct. 16, 1991

[51] Int. Cl.[5] .................... H01L 39/12; H01B 1/08
[52] U.S. Cl. ........................ 505/1; 505/735; 505/737; 423/593
[58] Field of Search .............. 423/593; 505/1, 735, 505/737, 783

[56] References Cited

U.S. PATENT DOCUMENTS

| | | | |
|---|---|---|---|
| 5,001,107 | 3/1991 | Bunker et al. | 505/783 |
| 5,002,926 | 3/1991 | Spencer et al. | 505/783 |
| 5,066,636 | 11/1991 | Liu et al. | 505/737 |
| 5,071,829 | 12/1991 | Chiang et al. | 423/593 |

FOREIGN PATENT DOCUMENTS 1-219004  9/1989  Japan.
1-224262  9/1989  Japan.

OTHER PUBLICATIONS

Martell, et al, Chemistry of the Metal Chelate Compounds, 1952, pp. 191–195.
Chiang, et al, "Preparation of high-purity Tl-based 1223 superconductor...in water solution", Appl. Phys. Lett. 58(21), May 27, 1991, pp. 2435–2437.
Hurng, et al., "Formation of (Tl, Pb, Bi)Sr$_{1.6}$Ca$_{2.4}$Cu$_3$O$_y$...by Nitrates Conversion", Solid State Comm. 79(5), Aug., 1991, pp. 431–415.
Liu, et al., Japanese Journal of Applied Physics, pt. II, 28(12), 1989, pp. L2155–L2157.
Kordas, et al., Applied Physics Letters, 57(14), 1990, pp. 1461–1463.

Primary Examiner—Michael Lewis
Assistant Examiner—Steven Bos
Attorney, Agent, or Firm—Scully, Scott, Murphy & Presser

[57] ABSTRACT

A preparation method for high-purity Tl-based superconductor phase of 115 K, and the precursor thereof. The process comprises a specific composition of precursors, represented by the formula:

$(Tl_aPb_bBi_c)Sr_{2-x}Ca_{2+x}Cu_yO_z$, wherein $(a+b+c)=1$, $0<x\leq 1$ and $2\leq y\leq 4$, for the manufacturing of Tl-based superconductor by adding oxalic acid as a chelating agent which equals to half the molar amount of total nitrate anions in the required metal nitrates aqueous solution and adjusting pH value of the solution to obtain the superconductor.

5 Claims, 5 Drawing Sheets

PREPARATION METHOD OF HIGH PURITY 115 K TL-BASED SUPERCONDUCTOR

BACKGROUND OF THE INVENTION

The present invention relates to a preparation method of high-purity Tl-based superconductor phase of 115K, and the precursor thereof, in particular, to a method of preparation of the Tl-based superconductor by adding oxalic acid as a chelating agent which equals to half the molar amount of total nitrate anions in the required metal nitrates aqueous solution to obtain the superconductor and the composition of the precursor, represented by the formula:

$$(Tl_aPb_bBi_c)Sr_{2-x}Ca_{2+x}Cu_yO_z,$$

wherein $(a+b+c)=1$, $0<x\leq 1$ and $2\leq y\leq 4$.

Since the discovery of high temperature superconductors in 1987, there are several superconductor systems with critical temperature (Tc) of above 77K. These include:

(1) Y-Ba-Cu-O system with the onset Tc of about 90-95K: superconductors of this system have the drawbacks of being unstable in air and moisture, and requiring strict conditions for the handling of the material.

(2) Bi-Pb-Sr-Ca-Cu-O system: the onset Tcs of the superconductors are divided into two, i.e., 80K and 110K, depending on the phases thereof.

(3) Tl-Ba-Ca-Cu-O system: the Tc of superconductors in this system is 125K which is the highest record of Tc. The drawbacks of these superconductors are unstability, quick weathering ageing in air and the released highly poisonous Tl vapor during treatment. The production process at high temperature is very dangerous. Although Pb and Bi are introduced to inhibit Tl vapor effectively, the synthesis of the superconductor phase will be reduced owing to Pb and Bi easily react with Ca and Ba.

(4) Tl-Pb-Bi-Sr-Ca-Cu-O system: Bi and Pb are introduced to reduce the amount of poisonous Tl vapor in the system, which leads to the same results as the above system, except that there is no interference phase, such as no production of Ca and Ba. The Tcs of this system are divided into 90K low-Tc phase and 115K high-Tc phase. The Tc may decrease by about 10% to 20% depending upon the processing of the materials. There are difficulties in application of the superconductor produced with Tc approaching 77K of liquid nitrogen, thus it is necessary to produce high-purity superconductor phase with 115K.

In conventional manufacturing processes for high temperature superconductor, three different methods were used. These methods include (1) solid-state reaction, (2) co-precipitation method, and (3) sol-sel solution. However, there are drawbacks in these methods. For instance, (1) solid-state reaction utilizes metal oxides or carbonates mixed and ground by hand or by machine and then sintered. This method will proceed at high temperature and sinter for a long time so as to overcome the defect of insufficient kinetic energy for diffusion of particles. The treatment of materials will result in low material quality and lack of uniformity of particles during the grinding process. Thus, the method is only suitable in a laboratory, not for large scale production. (2) Co-precipitation method is often used in the manufacturing of ceramic superconductors of two or three elements. Because species of high temperature superconductor cations are complicated and the constants of solubility products (Ksp) thereof are different, this method fails to form stable and accurate composition ratio. Moreover, potassium hydroxide (or sodium hydroxide) is employed to adjust the pH value of the solution, which will easily cause the pH value to vary uncontrolably and form ion pollution. The high saturated suspension will be gelated in sol-gel synthesis to form homogeneous precursors. Cations are closely combined with chelating agents in a complex reaction of a gelating process. The most commonly used chelating agents are organic acids, such as acetic acid, oxalic acid and citric acid. The sol-gel synthesis is not considered suitable for Bi- or Tl-based superconductors since Bi salts are not easily dissolved in water, and Tl (+3) compounds are easily reduced to Tl (+1) and lose the characteristic thereof.

Japanese Laid Open Patent No. 1,224,262 discloses the using of strong acid to dissolve Bi salts, and Japanese Laid Open Patent No. 1,219,004 discloses the use of ethylene glycol and EDTA to substitute the simple chelating agents and to purify Bi-based high temperature superconductors. These prior techniques above were provided to overcome the drawbacks of sol-gel synthesis. However, the treatments disclosed above for Bi-based are not satisfactory, for example, the sintering process becomes complicated and involves greater expenses.

Some prior inventions disclosed that a portion of materials was gelated to produce Tl-based superconductors. For instance, Liu et al. in Japanese Journal of Applied Physics, pt II, 28 (12), 1989, L2155-L2157 disclosed that modified citrates were used in gelation to produce high temperature superconductors. That is, Ca-Ba-Cu-O precursors were first made in gelation, and then mixed with thallium oxide in order to proceed with the step of sintering. However, this method does not improve the weaknesses of manufacturing processes because the reaction of Ca-Ba-Cu-O precursor and thallium oxide is the same as that of solid-state reaction.

Kordas et al. in Applied Physics Letters, 57 (14), 1990, 1461-1463 disclosed that the mixed valance state was accomplished by complicated thallium (+1) methoxyethoxide in a sol-gel synthesis in developing the Tl (+3) precursor. But the used organometallic compound cannot be manufactured easily, and the result of sintering is poor.

SUMMARY OF THE INVENTION

Thus, the present invention is to provide a preparation method of high-purity Tl-based superconductor phase of 115K, which overcomes the foregoing and related problems of conventional methods.

It is another object of the present invention to provide a preparation method for forming high purity superconductors.

Another object of the present invention is to provide a preparation method of high-purity Tl-based superconductor of 115K, comprising the steps of controlling specific chemical composition, selecting species of chelating agents and choosing thallium oxide as a gelating carrier.

A further object of the present invention is to provide a preparation method which can be employed in large scale industrial production and can be easily implemented.

These and other objects, advantages and features of the present invention will be more fully understood and appreciated by reference to the written specification.

BRIEF DESCRIPTION OF THE DRAWINGS

The present invention will be further explained with reference to the annexed drawings, wherein.

DETAILED DESCRIPTION OF THE INVENTION

Figure 1:
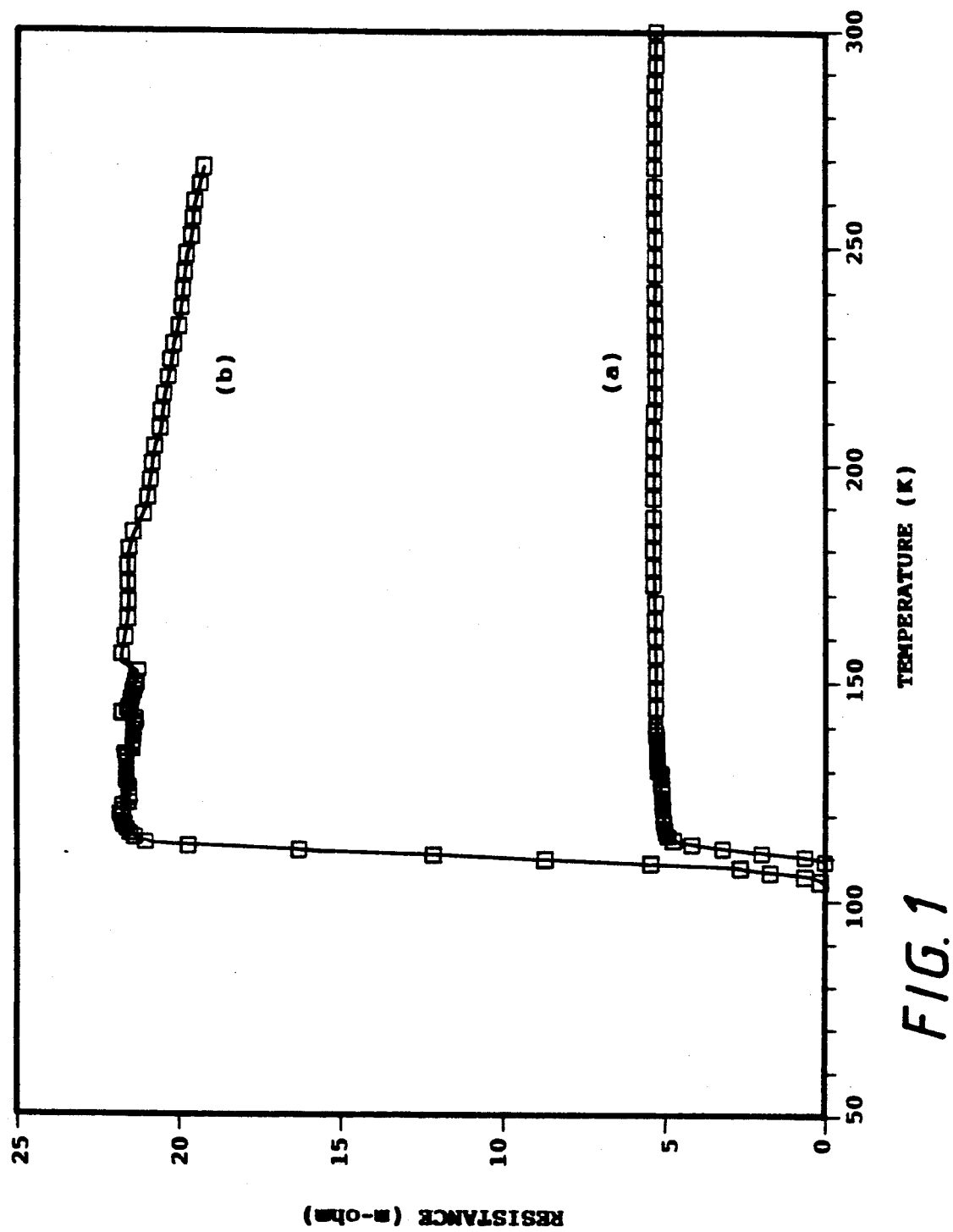
FIG. 1: Resistance-temperature curves for air-quenched (a) sample 1 (Tc=109K) and (b) sample 2 (Tc=103 K).

The present invention relates to a preparation method of high-purity Tl-based superconductor phase of 115K, and the precursor thereof, by using a specific composition $(Tl_aPb_bBi_c)Sr_{2-x}Ca_{2+x}Cu_yO_z$, wherein $(a+b+c)=1$, $0<x\leq 1$ and $2\leq y \leq 4$, of precursors for the superconductor, selecting species of chelating agents and choosing thallium (+3) oxide as a gelating carrier to obtain the desired superconductor. The process in accordance with this invention comprises the steps of:

(a) preparing an aqueous solution of thallium (+3) oxide and metal nitrates of Bi, Pb, Sr, Ca and Cu according to the composition ratio of $(Tl_aPb_bBi_c)Sr_{2-x}Ca_{2+x}Cu_yO_z$, wherein $(a+b+c)=1$, $0<x\leq 1$ and $2\leq y\leq 4$;

(b) adding oxalic acid as a chelating agent into the prepared aqueous solution, which equals to half the molar amount of total nitrate anions;

(c) adjusting pH=5-8 of the solution containing metal salts and chelating acid by using ammonia water, ethylenediamine or triethylamine;

(d) stirring vigorously and heating the solution to the temperature of about 100° to about 120° C. so as to proceed with gelation;

(e) heating the obtained complexed gel of step (d) for organic decomposition at 250° C./2 h and 300° C./1 h to form precursors in flaky shapes, then grinding to fine precursor powders; and (f) calcinating and sintering the precursor powders to obtain the desired product.

The preferred ranges of the composition $(Tl_aPb_bBi_c)Sr_{2-x}Ca_{2+x}Cu_yO_z$ comprise $a+b+c=1$, $0.55\leq a\leq 0.65$, $0.15\leq b\leq 0.25$, $0.15\leq c\leq 0.25$, $0.3\leq x\leq 0.5$ and $2.8\leq y\leq 3.2$.

Preferably, oxalic acid is added which equals to half the molar amount of total nitrate anions to compensate Tl salts and Bi salts with low solubilities. A 25% ammonium hydroxide solution is used to titrate the water solution, containing metal salts and chelating acid, to pH=6.5-7.5. Then stirring vigorously and heating at the temperature of 100°-120° C. to proceed gelation. The gel is organically decomposed at the temperature of about 200°-750° C. to form precursors. The gel may be heated at a temperature of 240°-260° C. and then at a temperature of 280°-320° C. Precursor powders are first treated at 700°-750° C. under flowing oxygen, then pelleted and oxygen-sintered at about 910°-940° C. for 2-4 hours in a previously heated tube furnace. Finally the samples are air-quenched and/or slowly cooled down to room temperature at the rate of 1°-3° C./min. Then the desired high-purity high temperature superconductor phase of 115K is obtained.

Samples of composition $(Tl_{0.6}Pb_{0.2}Bi_{0.2})Sr_2Ca_2Cu_3O_z$ (noted as sample 1, x=0) and $(Tl_{0.6}Pb_{0.2}Bi_{0.2})Sr_{1.6}Ca_{2.4}Cu_3O_z$ (noted as sample 2, x=0.4) were prepared. Metal salts for precursor preparation were thallium (+3) oxide and metal nitrates of Bi, Pb, Sr, Ca and Cu. For both samples, eight grams of oxalic acid were added based on six grams of copper nitrate, which equal to half the molar amount of total nitrate anions.

The structural characterization is investigated by x-ray diffraction (XRD) using a Shimadzu XD-3A diffractometer with Cu K$\alpha$ radiation ($\lambda=1.5418$ A). The electrical resistivity is measured using a standard four-probe technique. A Quantum Design superconductor quantum interference device (SQUID) magnetometer is used to record the magnetization data in a field of 10 Oe between 5 and 130K.

The synthesis provides a relatively fast kinetics using an organic material to emulsify different solid particles into semi-rigid gels. Unlike the superfine precursor particles seen in the Bi-Pb-Sr-Ca-Cu-O system, the precursor powders out of samples 1 and 2 agglomerate into flakes because of the $Tl_2O_3$. Most of the organics are removed by evaporation after thermal treatment at 250° C./1 h and 300° C./1 h. Thorough organic decomposition is established at higher temperatures, where the precursors dehydrate to the final product.

The choice of oxalic acid is determined by the number of functional groups for chelating metal cations. The amount of chelating agent determies whether there is a chemically clean reaction that would influence the desired phase formation. This can be particularly illustrated when bismuth nitrate and thallium (+3) oxide have poor solubilities.

Figure 2:
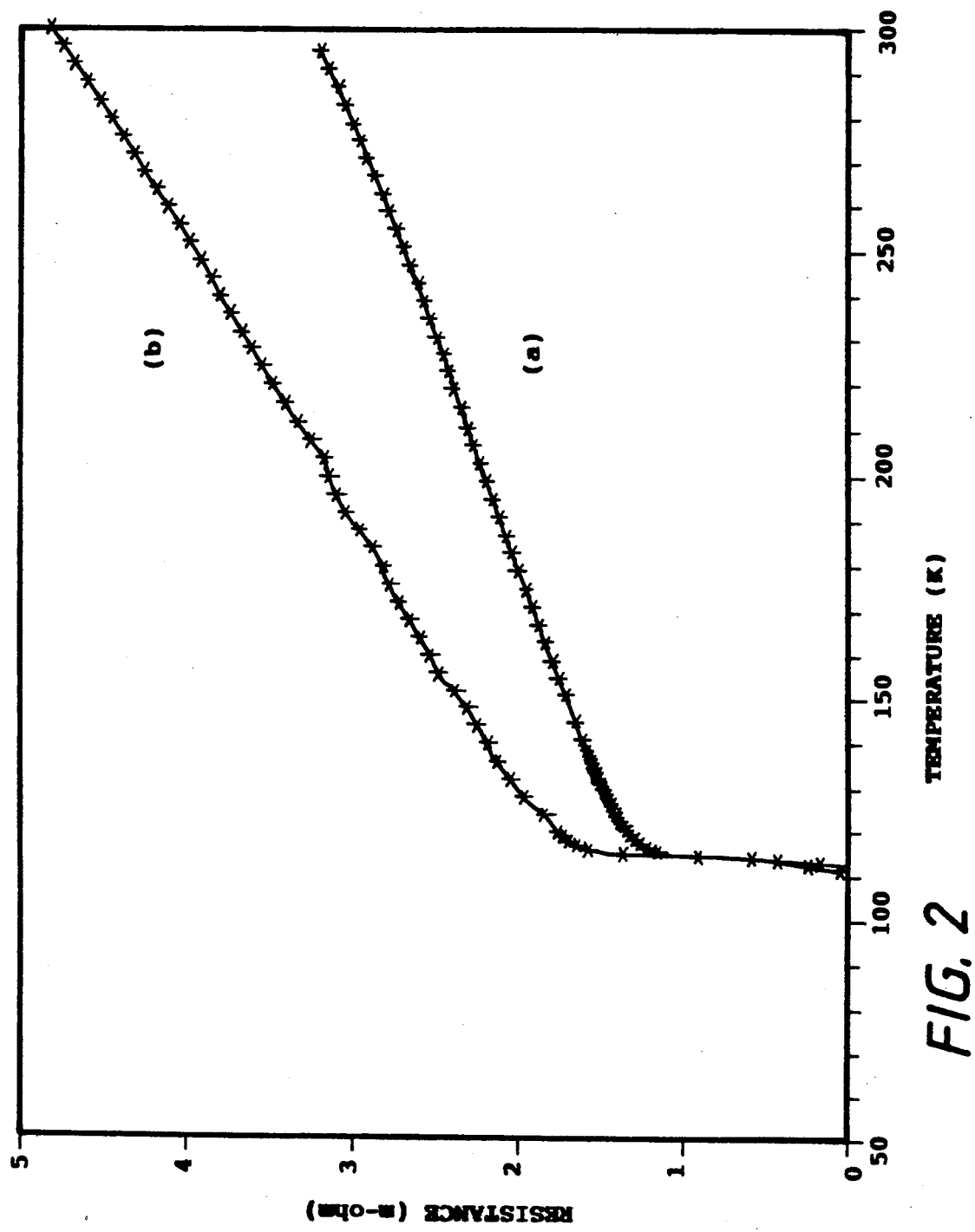
FIG. 2: Resistance-temperature curves for furnace-cooled (a) sample 1 (Tc=112K) and (b) sample 2 (Tc=115 K).
Figure 3:
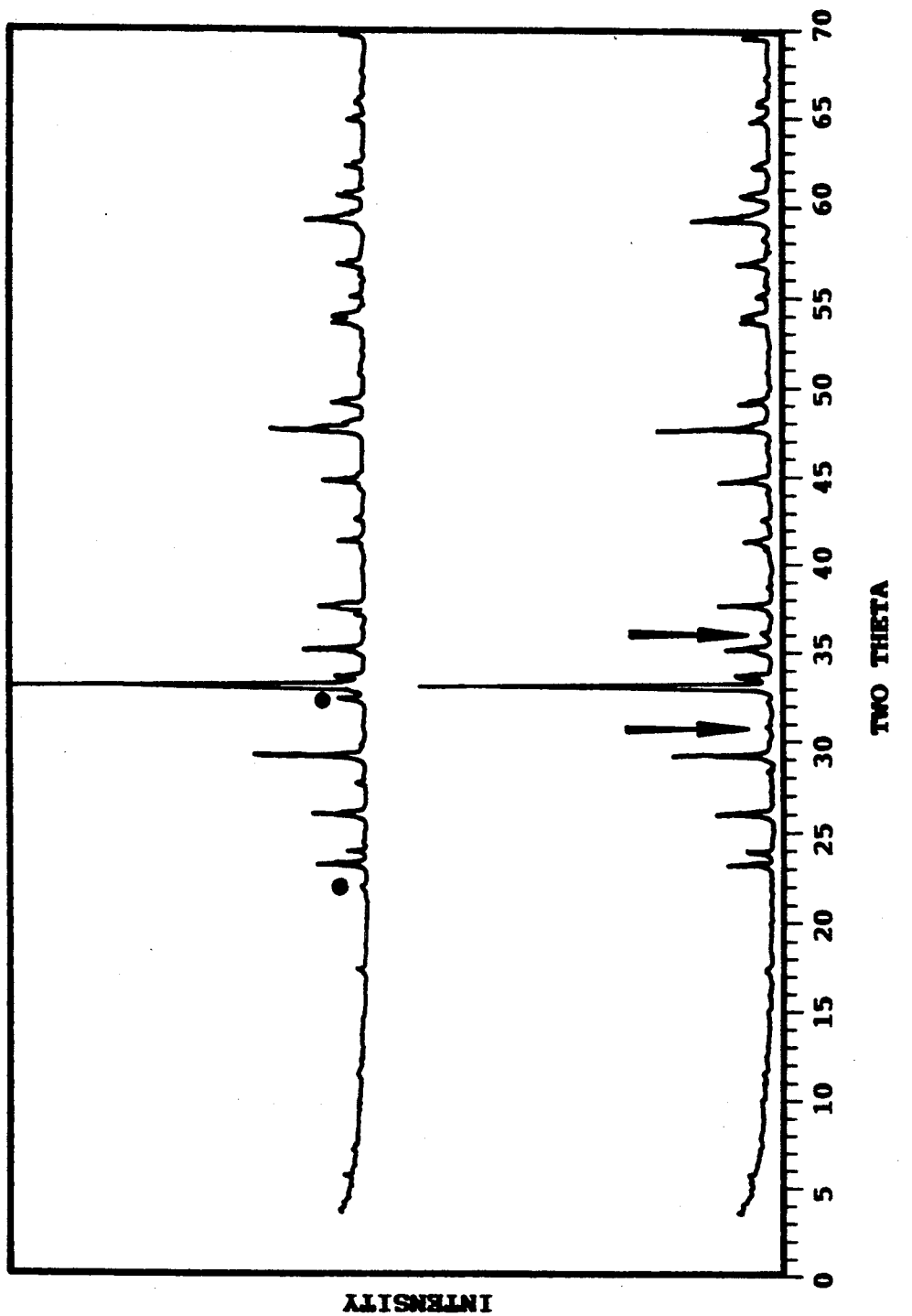
FIG. 3: X-ray diffraction patterns of air-quenched sample 1 (above) and sample 2 (below). Low Tc phase residue and solid solution intermediates are given in circles and arrows, respectively.
Figure 4:
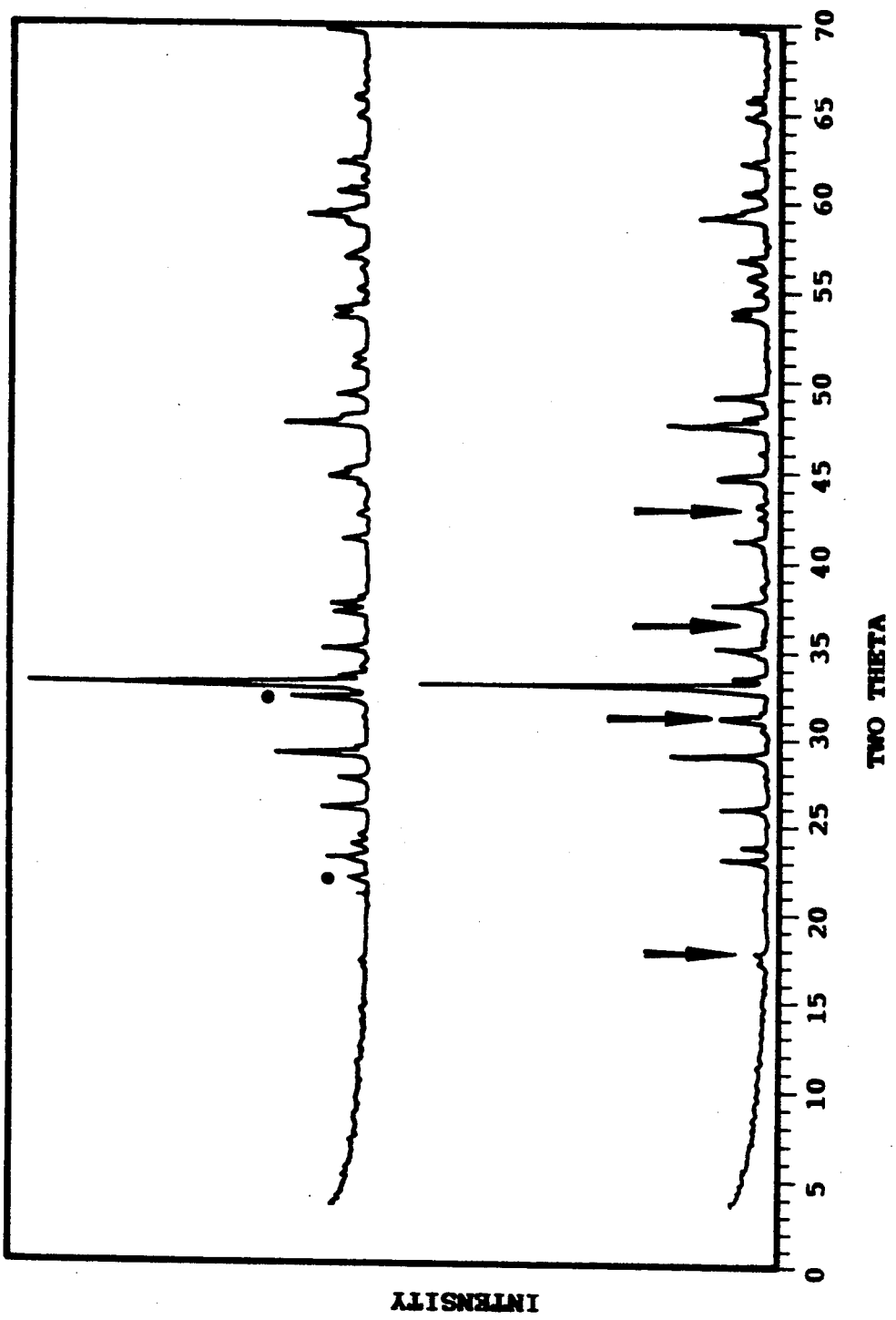
FIG. 4: X-ray diffraction patterns of furnace-cooled sample 1 (above) and sample 2 (below). Low Tc phase residue and solid solution intermediates are given in circles and arrows, respectively.

The detailed results of FIGS. 1 to 5 are obtained from the following comparative examples. In order to show the effect of the present invention, the results are discussed below. In general, sample 2 (x=0.4) has better performance regarding to the phase purity. It has to be noted that furnace cooling after high-temperature calcination has a strong impact on the intergrowth, compared to the inadequately connected grains out of the quenched materials. Evidence given in FIGS. 1 and 2 are resistance-temperature relations. Quenched samples show semiconductor characteristics before the onset temperature, while furnace-cooled samples exhibit perfect metallic and superconductor behaviors of improved Tc. Better properties of sample 2 are consistently observed in x-ray diffraction patterns. FIG. 3 shows the quenched sample 1 (x=0) with remarkable residues of the low Tc phase. Comparable results occurred with the furnace-cooled sample 1 (FIG. 4).

Figure 5:
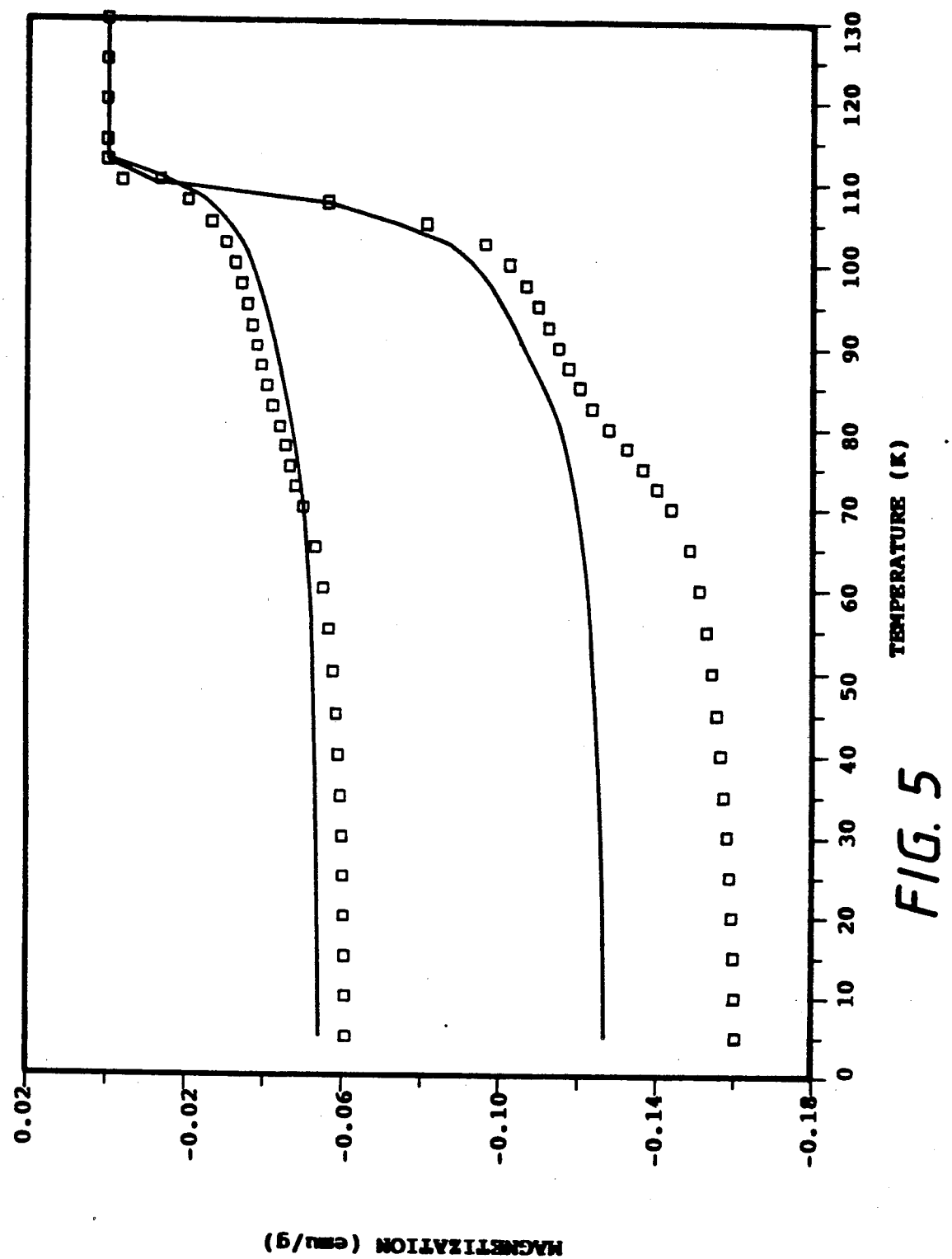
FIG. 5: Magnetization measurement of furnace-cooled sample 1 (square) and sample 2 (line). Data were recorded by zero-field cooling (ZFC) and 10 Oe field cooling (FC).

FIG. 5 shows the magnetization curves of furnace-cooled powder samples. The temperatures at which the sharp transition of diamagnetic into superconducting state occurred are in agreement with the Tc results. An obvious imperfection is observed around 90K for sample 1 (x=0), which relates to the low Tc phase residue. Confirming the 115K phase purity, sample 2 (x=0.4) shows a smooth curvature without perceptible second phase transition in both of the zero-field-cooled (below) and the field-cooled curves (above).

The following examples are offered by way of illustration. The examples are not intended to be limiting to the scope of the invention in any respect and should not be so construed.

EXAMPLES

COMPARATIVE EXAMPLE 1

According to the composition of sample 1, i.e., $(Tl_{0.6}Pb_{0.2}Bi_{0.2})Sr_2Ca_2Cu_3O_z$, adequate amounts of metal salts for precursor preparation comprising $Bi(NO_3)_3 \cdot 5H_2O$, $Pb(NO_3)_2$, $Sr(NO_3)_2$, $Ca(NO_3)_2 \cdot 4H_2O$, $Cu(NO_3)_2 \cdot 3H_2O$ and $Tl_2O_3$ solid powders are dissolved in deionized water. After the components are added, the solution is stirred; only bismuth nitrate and thallium oxide were not fully dissolved. Eight grams of oxalic acid as a chelating agent are added based on six grams of copper nitrate, which equal to half the molar amount of total nitrate anions. The water solution containing metal salts and chelating acid is titrated with ammonia water to pH=7.25. The solution is then placed in an oil bath and vigorously stirred for gelation at 100°–120° C. The gel is placed into a box furnace for organic decomposition at 250° and 300° C., forming black precursors in flaky shapes. Precursor powders are first treated at 700°–750° C. under flowing oxygen, then pelleted and oxygen-sintered at 930° C. for 3 hours in a previously heated tube furnace. Samples for the final calcination must be sealed by 99.99% pure gold foil of 0.5 mm thickness. The obtained samples are divided into two portions. One is air-quenched and the other is slowly cooled down to room temperature at a rate of 2° C./min. Resistance-temperature curves for the obtained product from sample 1, with air-quenched and furnace-cooled, are shown in (a) of FIGS. 1 and 2, respectively. The X-ray diffraction patterns of the obtained product from sample 1, with air-quenched and furnace-cooled, are also shown on the upper half of FIGS. 3 and 4, respectively. Magnetization measurement of the obtained product from sample 1 with furnace-cooled is shown in FIG. 5, denoted by the squares. The results show that the obtained product is not exact superconductor phase of 115K.

COMPARATIVE EXAMPLE 2

The treatment and operation are the same as that described in comparative example 1, except that the composition is according to sample 2, i.e., $(Tl_{0.6}Pb_{0.2}Bi_{0.2})Sr_{1.6}Ca_{2.4}Cu_3O_z$. After the precursor powders have been oxygen-sintered at 930° C. for 3 hours, the samples are air-quenched to obtain the final product from sample 2. The resistance-temperature curve for the obtained sample 2 is shown in (b) of FIG. 1. The x-ray diffraction patterns of the obtained sample 2 are shown on the bottom half of FIG. 3. The results show that the obtained product is not exact superconductor phase of 115K.

EXAMPLE 1

According to the composition of sample 2, i.e., $(Tl_{0.6}Pb_{0.2}Bi_{0.2})Sr_{1.6}Ca_{2.4}Cu_3O_z$, adequate amount of metal salts for precursor preparation comprising $Bi(NO_3)_3 \cdot 5H_2O$, $Pb(NO_3)_2$, $Sr(NO_3)_2$, $Ca(NO_3)_2 \cdot 4H_2O$, $Cu(NO_3)_2 \cdot 3H_2O$ and $Tl_2O_3$ solid powders are dissolved in deionized water. After vigorously stirring, only bismuth nitrate and thallium oxide are not fully dissolved. Eight grams of oxalic acid as a chelating agent are added based on six grams of copper nitrate, which equal to half the molar amount of total nitrate anions. The water solution containing metal salts and chelating acid is titrated with a 25% ammonium hydroxide solution to pH=7.1–7.3. The solution is then placed in an oil bath and is vigorously stirred for gelation at 100°–120° C. Due to the $Tl_2O_3$ in the gel, the color of the complexed gel becomes black. The gel is placed into a box furnace for organic decomposition at 250° C./2 h and 300° C./1 h, forming black precursors in flaky shapes. Precursor powders are first treated at 700°–750° C. under flowing oxygen, then pelleted and oxygen-sintered at 930° C. for 3 hours. Samples for the final calcination must be sealed by 99.99% pure gold foil of 0.5 mm thickness. Finally the sample is slowly cooled down to room temperature at 2° C./min. The resistance-temperature curve for the obtained product from sample 2 is shown in (b) of FIG. 2. The x-ray diffraction pattern of the obtained sample 2 is shown on the bottom half of FIG. 4. The magnetization measurement of the obtained sample 2 is shown in FIG. 5. The above results show that the obtained product is high-purity superconductor phase of 115K.

Of course it is understood that the above is merely a preferred embodiment of the invention and that various changes and alterations can be made without departing from the spirit and broader aspects thereof as set forth in the appended claims.

We claim:

1. A preparation method of high purity 115K Tl-based superconductor comprising the steps of:
   (a) preparing an aqueous solution of thallium (+3) oxide and metal nitrates of Bi, Pb, Sr, Ca and Cu in composition ratio of $(Tl_aPb_bBi_c)Sr_{2-x}Ca_{2+x}Cu_yO_z$, wherein $(a+b+c)=1$, $0.55 \leq a \leq 0.65$, $0.15 \leq b \leq 0.25$, $0.15 \leq c \leq 0.25$, $0 < x \leq 1$ and $2 \leq y \leq 4$;
   (b) adding oxalic acid as a chelating agent into the prepared aqueous solution, which equals half the molar amount of total nitrate anions;
   (c) adjusting pH=5–8 of the solution containing metal salts and chelating acid by adding ammonia water, ethylenediamine or triethylamine;
   (d) stirring vigorously and heating the solution to a temperature of about 100° to about 120° C. to form a gel;
   (e) heating the obtained gel of step (d) for organic decomposition at 200°–750° C. to form precursors in flaky shapes, then grinding to fine precursor powders; and
   (f) calcinating and sintering the precursor powders to obtain the superconductor product.

2. A preparation method as set forth in claim 1, wherein ammonia water is added to adjust pH value of step (c).

3. A preparation method as set forth in claim 1, wherein the pH value of step (c) is 6.5–7.5.

4. A preparation method as set forth in claim 1, wherein the gel of step (e) is heated at a temperature of 240°–260° C. and then at a temperature of 280°–320° C.

5. A preparation method as set forth in claim 1, wherein the products obtained in step (f) are calcinated at 700°–750° C. for 8–12 hours, then oxygen-sintered at 920°–940° C. for 2–4 hours.

* * * * *